US009673488B2

(12) United States Patent
Tzivanopoulos

(10) Patent No.: US 9,673,488 B2
(45) Date of Patent: Jun. 6, 2017

(54) BATTERY SYSTEM HAVING A SEPARATELY CONNECTED DETERMINATION CIRCUIT, BATTERY, AND MOTOR VEHICLE HAVING A BATTERY SYSTEM

(71) Applicant: Chrysanthos Tzivanopoulos, Remseck Am Neckar (DE)

(72) Inventor: Chrysanthos Tzivanopoulos, Remseck Am Neckar (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 198 days.

(21) Appl. No.: 14/403,590

(22) PCT Filed: May 17, 2013

(86) PCT No.: PCT/EP2013/060217
§ 371 (c)(1),
(2) Date: Nov. 25, 2014

(87) PCT Pub. No.: WO2013/178483
PCT Pub. Date: Dec. 5, 2013

(65) Prior Publication Data
US 2015/0125726 A1    May 7, 2015

(30) Foreign Application Priority Data

May 31, 2012   (DE) .................. 10 2012 209 177

(51) Int. Cl.
*H01M 10/42*   (2006.01)
*G01R 31/36*   (2006.01)
(Continued)

(52) U.S. Cl.
CPC ...... *H01M 10/425* (2013.01); *G01R 19/0092* (2013.01); *G01R 31/3606* (2013.01);
(Continued)

(58) Field of Classification Search
None
See application file for complete search history.

(56) References Cited

U.S. PATENT DOCUMENTS 7,148,808 B1    12/2006   Pfahlert et al.
2011/0057658 A1*   3/2011   Yugou ................... B60L 7/10
324/426

FOREIGN PATENT DOCUMENTS

DE   10 2004 049 153 A1   4/2006
DE   10 2007 029 156 A1   1/2009
(Continued)

OTHER PUBLICATIONS

International Search Report corresponding to PCT Application No. PCT/EP2013/060217, mailed Aug. 26, 2013 (German and English language document) (7 pages).

*Primary Examiner* — Scott J Chmielecki
(74) *Attorney, Agent, or Firm* — Maginot, Moore & Beck LLP

(57) ABSTRACT

The disclosure relates to a battery system, a battery, and a motor vehicle having a battery system. In order to be able to determine a battery current flowing through the battery system, the battery system has a measuring unit and a determination unit, which are connected to a battery line of the battery system by means of separate contact or connection points.

10 Claims, 2 Drawing Sheets

(51) Int. Cl.
    *G01R 19/00*         (2006.01)
    *H01M 10/0525*     (2010.01)
    *H01M 10/48*        (2006.01)
    *G01R 15/14*        (2006.01)
    *G01R 19/165*      (2006.01)

(52) U.S. Cl.
    CPC .... *G01R 31/3644* (2013.01); *H01M 10/0525* (2013.01); *H01M 10/482* (2013.01); *G01R 15/146* (2013.01); *G01R 19/16542* (2013.01); *H01M 2010/4278* (2013.01); *H01M 2220/20* (2013.01)

(56) References Cited

FOREIGN PATENT DOCUMENTS

| | | |
|---|---|---|
| DE | 10 2010 039 891 A1 | 3/2012 |
| DE | 10 2010 040 713 A1 | 3/2012 |
| EP | 1 411 364 A1 | 4/2004 |
| GB | 2 453 207 A | 4/2009 |

\* cited by examiner

BATTERY SYSTEM HAVING A SEPARATELY CONNECTED DETERMINATION CIRCUIT, BATTERY, AND MOTOR VEHICLE HAVING A BATTERY SYSTEM

This application is a 35 U.S.C. §371 National Stage Application of PCT/EP2013/060217, filed on May 17, 2013, which claims the benefit of priority to Serial No. DE 10 2012 209 177.7, filed on May 31, 2012 in Germany, the disclosures of which are incorporated herein by reference in their entirety.

The present disclosure relates to a battery system comprising a battery string having at least one battery cell, comprising a measurement unit, which has a current sensor, which is connected in series with the at least one battery cell, and comprising a determination unit for determining a battery current flowing through the battery string during operation of the battery system, wherein the determination unit has a determination circuit, which is connected, with transmission of signals, to the measurement unit and draws operational energy from the battery string. The disclosure furthermore relates to a battery and a motor vehicle comprising a battery system.

BACKGROUND

Battery systems of the type mentioned at the outset and batteries and motor vehicles comprising such battery systems are known. The battery systems or the batteries comprising battery systems are used, for example, in motor vehicles with an electric drive, as are used, for example, in hybrid technology or in vehicles driven purely by an electric motor. The battery system can in this case be provided as the only energy source or as a supporting energy source for the motor vehicle drive. In order to drive a vehicle, it may be necessary for the battery system to be a high-voltage/high-current battery system which produces electrical energy for the drive of the motor vehicle, wherein the electric drive energy has high voltages, for example of 800 V, and/or high currents, for example of 250 A.

In order to be able to ensure safe operation of the battery system, the determination unit is provided. This determines the battery current output by the battery system during operation and measured by the measurement unit and can indicate a fault case, for example in the case of impermissible battery currents.

For example, EP 1 411 364 B1 discloses a battery comprising a determination unit formed separately from the battery, with which determination unit a battery current output by the battery is monitored during operation. DE 10 2004 049 153 A1 discloses a conductor section which can be connected to a battery and which is formed with a measurement section. Battery currents flowing through this measurement section can be determined by a determination unit which can be connected to the measurement section. The determination units described in these documents are formed as separate units for connection to battery contacts of the battery. As a result, the known determination units require a certain amount of installation space outside the battery. However, installation space is very limited, in particular in the case of an automotive application. Furthermore, the known external determination units can only measure battery currents output by the battery. Internal battery currents cannot be determined.

Although the known apparatuses contribute to the operational safety of the battery system since they can identify impermissible high battery currents, it may arise that, owing to the type of connection used for the determination units, these determination units are susceptible to electromagnetic interference. As the distance from the at least one battery cell increases, the line length between the respective determination unit and the battery cell also increases, as a result of which it is more probable that electromagnetic interference influencing the battery current measurement is coupled into an impermissible degree for the determination unit. As a result, the operational safety of the battery system, the battery and/or the motor vehicle can be reduced.

SUMMARY

In accordance with the disclosure, a battery system of the type mentioned at the outset is provided in which the current sensor is incorporated in the battery string so as to conduct battery current via contact points, and the determination circuit is connected to the battery string so as to transmit energy by connection points, wherein the contact points are formed separately from the connection points.

By virtue of the integration of the current sensor in the battery string, all of the battery currents flowing through the battery string, i.e. for example charging currents flowing to the at least one battery cell or discharge currents flowing away from said battery cell, can be measured. The separation of the contact points from the connection points enables an arrangement of the determination circuit which is independent of the arrangement of the current sensor. As a result, the installation space within the battery system or the installation space available in the battery for the battery system can be used in optimum fashion. There is also the possibility of arranging the determination circuit outside the battery, for example in a control device.

The disclosure can be improved further by various configurations which are each advantageous per se and can be combined with one another as desired. Details will be given of these configurations and the advantages associated therewith below.

In accordance with a first embodiment, the battery string can comprise at least one battery cell and extend between connection contacts of the battery system, wherein the connection contacts of the battery string are connectable to connection contacts of the battery or can form the connection contacts of the battery.

In accordance with a further advantageous configuration, the battery string can have at least two battery cells connected in series with one another. Depending on how much electrical energy or power is intended to be provided by the battery system, the battery string can also have more than two battery cells, which are connected in series or in parallel with one another, as required. If the battery string has such a network of battery cells which are connected in parallel with one another, this network can be connected in series with a further battery cell or another network and with the current sensor. For reasons of simplicity, individual battery cells and networks of parallel battery cells are merely referred to below using the term battery cell since they can be used, as required, without impairing the function of the battery system according to the disclosure.

In particular, the current sensor can be integrated in the battery string between one of the connection contacts of the battery system and a first or last battery cell of the battery string. The first or last battery cell of the battery string is in this case the battery cell which is connected as the first battery cell upstream of or downstream of one of the connection contacts. For example, at least one of the connection contacts of the battery system is connected to the battery string and in particular to the first or last battery cell via a connection line. If the current sensor is arranged at the end of the battery string, its contact point which is remote from the next battery cell connected to it can be linked directly to the connection line. Another contact point of the current sensor can in this case be connected to the negative terminal or to the positive terminal of this battery cell.

The determination unit can be connected in parallel with the battery string, wherein the connection points of the determination unit preferably make contact with the connection lines of the battery system. If the current sensor is connected to the negative terminal of the first or last battery cell and the determination unit is connected in parallel with the battery string, there is an identical reference potential present at the determination unit and at the current sensor, even if all of the connection points are physically separated from the contact points by at least one section of one of the connection lines. A section of the connection line which, where possible, connects in each case one of the connection points to one of the contact points generally causes at most a negligible potential difference.

The current sensor can be incorporated in the battery string not only at the start or at the end of the battery string, i.e. upstream of or downstream of all of the battery cells of the battery string. If desired for reasons of space, thermal or electrical boundary conditions, for example, the current sensor can alternatively be integrated in the battery string between the battery cells and in this case is preferably connected in series with said battery cells in order that the total current flowing through the battery string is conducted through the current sensor.

In this case, too, the connection points of the determination unit are connected to the battery string and in particular to different ends of the battery string, spaced apart from the contact points of the current sensor.

The difference resulting from this arrangement of the current sensor and the determination unit in terms of the respective reference potentials can result in interference in the determination of the battery current, however, in particular when the current sensor is electrically conductively connected to the determination unit. In order to be able to safely determine the battery current despite the different reference potentials of the current sensor and the determination unit, the battery system can have a reference potential converter. The reference potential converter can be, for example, part of the determination unit.

The reference potential converter can connect the current sensor and the determination circuit to one another in such a way as to conduct signals. A measurement signal generated by the current sensor can therefore be passed to the determination circuit by the reference potential converter. During operation, the reference potential converter receives a signal which is dependent on the measurement signal on the input side, wherein preferably the reference potential of the current sensor is present at the reference potential converter on the input side. On the output side, the reference potential converter can be connected to the determination circuit in such a way as to conduct signals and can output the signal which is dependent on the measurement signal to the determination circuit, wherein preferably the reference potential of the determination unit is present at the reference potential converter on the output side.

The reference potential converter can galvanically isolate the current sensor and the determination unit from one another and can be formed, for example, with a transformer. The galvanic isolation of the determination unit further results in a further increase in operational safety. Should the energy-transmitting connection of the determination unit to the reference potential be interrupted, the galvanic isolation suppresses a flow of electrical energy away from the determination unit to the measurement unit, which could be impaired or even damaged by the flow of energy. Even when fitting the battery system without the galvanic isolation by the reference potential converter care would always have to be taken to ensure that the individual component parts are connected to one another in the correct order. If the reference potential converter according to the disclosure is provided, the component parts of the battery system can be connected to one another in any order without electrical energy flowing out of the battery string and through the measurement unit or the determination unit unintentionally and to a degree which is hazardous for said measurement unit or said determination unit during fitting of the battery system.

If the current sensor and the determination unit are arranged physically spaced apart from one another, they need to be connected to one another via connecting lines. As the length of the connecting lines increases, however, the risk also increases of the measurement signal generated by the current sensor being subject to such high levels of interference as a result of electromagnetic influences that the determination unit can no longer reliably determine the battery current. In particular analog measurement signals are susceptible to electromagnetic interference. Such interference is often generated by electrically driven motor vehicles, however. In order to be able to safely determine the battery current even when using long connecting lines, therefore, the battery system can have a measurement signal transducer, which converts a measurement signal generated by the current sensor into a data signal. Primarily digital data signals can be configured so as to be insensitive to electromagnetic interference and so as to also be transmittable safely over relatively long connecting lines, which may have a length of several tens of centimeters or else several meters, for example. The measurement signal transducer is preferably arranged close to the current sensor and in particular is part of the measurement unit.

The signal present at the reference potential converter on the input side can therefore be the digital data signal generated by the measurement signal transducer. The reference potential converter can consequently connect the measurement signal transducer to the determination circuit in such a way as to transmit data signals, as a result of which robust and, where possible, fault-tolerant signal transmission to the determination circuit is possible. In this case, the reference potential of the current sensor can be present at the measurement signal transducer both on the input side and on the output side.

At least the determination circuit and, where possible, also the measurement signal transducer and the reference potential converter should be supplied operational energy during operation. Owing to the different reference potentials, at least the measurement signal transducer and the determination circuit cannot be supplied identical operational energy. In order to now avoid separate supply units needing to be provided for the measurement signal transducer and the determination unit, which would be disadvantageous both in terms of space and in terms of cost, the battery system is preferably designed with a supply unit, which, during operation, supplies operational energy drawn from the battery string to a first supply circuit for the determination circuit and to a second supply circuit for the measurement unit or the measurement signal transducer. In order to be able to supply operational energy to the determination circuit and, where possible, also the measurement signal transducer, a reference potential of the first supply circuit can correspond to the reference potential of the determination circuit, and a reference potential of the second supply circuit can correspond to the reference potential of the current sensor.

The supply unit can be designed in such a way that, during operation, the first supply circuit supplies operational energy, for example for the measurement unit, to the second supply circuit. For example, the supply unit can be formed with a transformer, which galvanically isolates or decouples the first supply circuit from the second supply circuit in such a way as to transmit energy.

The determination unit can evaluate the measurement or data signal and/or compare this signal with setpoint values and, in the event of excessively large discrepancies between the battery current and the setpoint values, provide a fault signal.

In a possible configuration which is simple and inexpensive to implement, the current sensor is in the form of a so-called shunt resistor, i.e. a resistor with a low resistance, across which there is an electric voltage drop which is dependent on the current flowing through said resistor. This electric voltage can be used as measurement signal and supplied to the measurement signal transducer, for example.

In addition to the battery system, the battery according to the disclosure can have a housing and connection contacts for connecting an external consumer, for example drive motors of the motor vehicle. The connection contacts of the battery can be connected to the connection contacts of the battery system in such a way as to conduct battery current, or the connection contacts of the battery system can form the connection contacts of the battery.

In the motor vehicle according to the disclosure, the battery system can be provided and integrated at least partially or even completely in at least one battery of the motor vehicle. At least the determination circuit and, where possible, even the determination unit can be arranged outside the battery, for example in a control device.

At least one battery cell of the battery string can be in the form of a rechargeable lithium-ion battery. As an alternative or in addition, other battery technologies for the at least one battery cell of the battery string can also be used. The battery system can also comprise other electrical energy stores, for example capacitors. The battery system can be connected to a battery management system or the battery management system can at least comprise the determination unit. At least the determination circuit and, where possible, also the supply unit can be connected to the battery string in such a way as to conduct energy by at least one switching element, with the result that, in a switched-off state of the battery system, energy does not flow away out of the battery string unintentionally.

BRIEF DESCRIPTION OF THE DRAWINGS

The disclosure will be explained by way of example below using exemplary embodiments with reference to the drawings. The different features of the exemplary embodiments can in this case be combined independently of one another, as has been set forth in the individual advantageous configurations already. In the drawings.

DETAILED DESCRIPTION

First, the design and function of a battery system according to the disclosure will be described with reference to the exemplary embodiment shown in FIG. 1.

Figure 1:
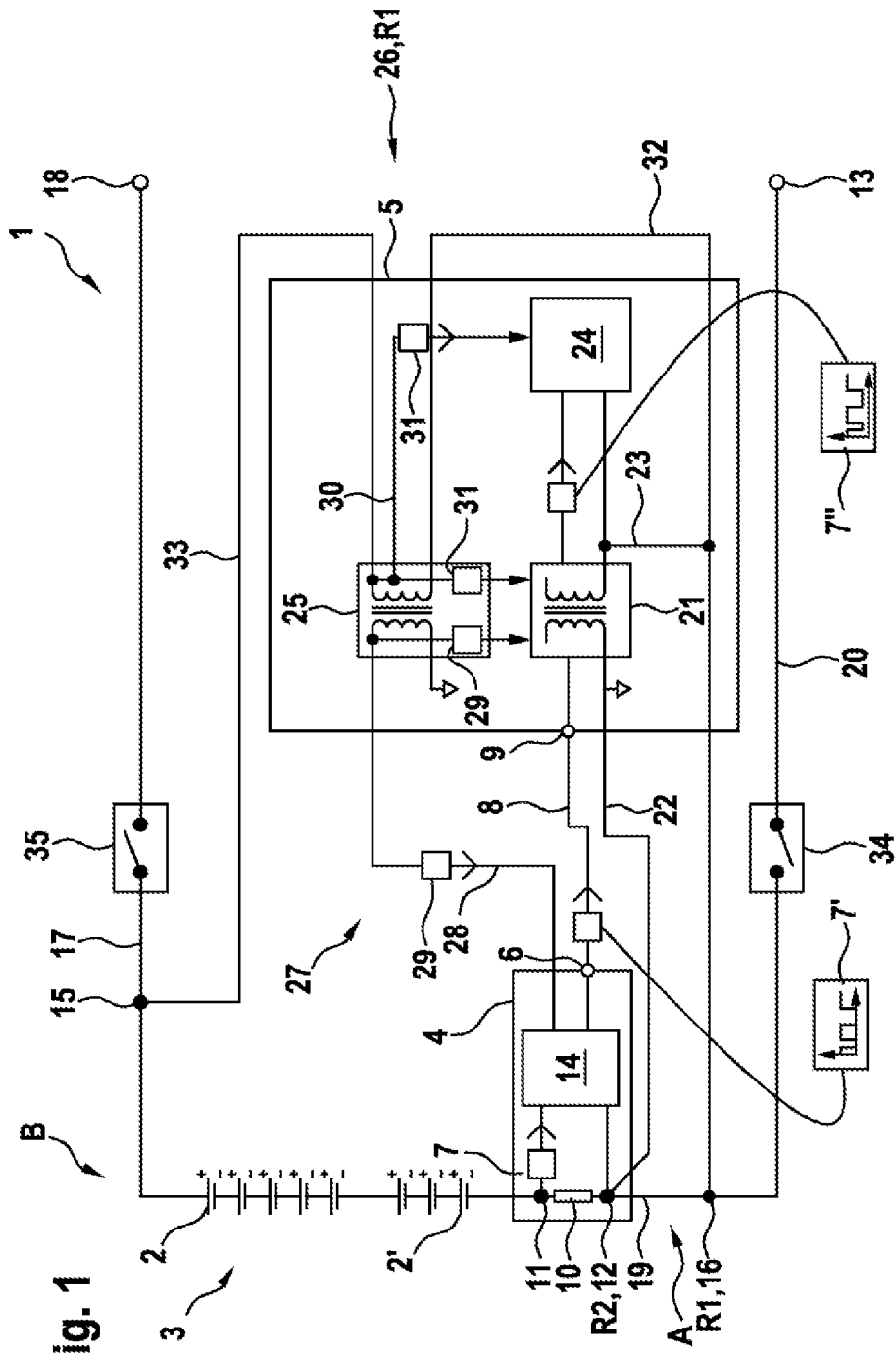
FIG. 1 shows a schematic illustration of an exemplary embodiment of the battery system according to the disclosure.

FIG. 1 shows the battery system 1 comprising a battery string 3 having a plurality of battery cells 2. In order to determine a battery current flowing through the battery string 3, the battery system 1 furthermore has a measurement unit 4, by means of which a measurement signal which is dependent on the battery current can be generated. The battery system 1 is furthermore provided with a determination unit 5, which is connected to the measurement unit 4 in such a way as to transmit signals.

During operation, a signal 7, which is generated by the measurement unit 4 during operation depending on the battery current, is present at a signal output 6 of the measurement unit 4. The signal 7 is supplied to the determination unit 5 via a signal line 8, which is connected to a signal input 9 of the determination unit 5.

The measurement unit 4 is provided with a current sensor 10, which is incorporated in the battery string by means of two contact points 11, 12 and is connected in series with the at least one battery cell 2. In the exemplary embodiment illustrated, the battery string 3 is equipped with a plurality of battery cells 2, wherein a battery cell 2' is a first or last battery cell of the battery string 3. The contact point 11 is connected to the battery cell 2' and in particular to the negative terminal thereof. The other contact point 12 of the current sensor 10 is not connected to one of the battery cells 2, but to a connection contact 13 of the battery system 1. If the battery string 3 is defined by the battery cells 2 and the current sensor 10, the current sensor 10 is arranged at one end A of the battery string 3, in the exemplary embodiment shown in FIG. 1. Alternatively, the current sensor 10 can also be arranged at an end B, opposite the end A, of the battery string 3 and then be connected to a positive terminal of the last or first battery cell 2'.

In order to convert the measurement signal 7 generated by the current sensor 10 into a signal which is more easily transmittable, the battery system 1 is additionally configured with a measurement signal transducer 14. On the input side, the measurement signal transducer 14 receives the analog measurement signal 7, which is generated by the current sensor 10, for example an electric voltage which is dependent on the current flowing through the battery string. The current sensor 10 can be in the form of a so-called shunt, i.e. a resistor with a low resistance. If the battery current is flowing through the current sensor 10, there is an electric voltage drop across the current sensor 10 which is dependent on the battery current, which voltage can be picked up as measurement signal 7 by the measurement signal transducer 14 and converted. The measurement signal transducer 14 can provide the measurement signal 7 provided by the current sensor 10 as a digital signal 7' to the signal output 6 of the measurement unit 4. The signal 7' output by the measurement unit 4 can therefore be a digital data signal.

In order to be able to connect the current sensor 10 in optimum fashion to the battery string 3 without the positioning of said current sensor being impaired by the determination unit 5, the determination unit 5 is connected to the battery string 3 via separate connection points 15, 16 in such a way as to transmit energy. The determination unit 5 is connected in parallel with the battery string 3 in the exemplary embodiment shown in FIG. 1. The connection point 15 is electrically conductively coupled to a connection line 17 at that end B of the battery string 3 which is opposite the current sensor 10. The connection line 17 connects the battery string 3 to a further connection contact 18 of the battery system 1. The second connection point 16 of the determination unit 5 is spaced apart from the contact point 12 by a section 19 of a further connection line 20, but is electrically conductively connected thereto. Owing to the electrically conductive connection between the contact point 12 and the connection point 16, there are similar or even identical electrical potentials or reference potentials R1, R2 present at these two points 12, 16.

Should the potential difference between the reference potentials R1, R2 be so great that the signal 7, 7' of the measurement unit 4 can no longer readily be used in the determination unit 5, however, the battery system 1 can be equipped with a reference potential converter 21. The reference potential R2 of the current sensor 10 can be supplied to the reference potential converter 21 on the input side. For this purpose, the reference potential converter 21 can be connected to the contact point 12 via a potential line 22. On the output side, the reference potential R1 of the determination unit 5 can be supplied to the reference potential converter 21. For this purpose, in the exemplary embodiment shown in FIG. 1, a potential line 23 is provided, which connects the reference potential converter 21 to the connection point 16.

In addition, the signal 7, 7' of the measurement unit 4 is supplied to the reference potential converter 21. If the reference potential converter 21 is part of the determination unit 5, it can be connected on the input side to the signal input 9 in such a way as to conduct signals. On the output side, the reference potential converter 21 outputs the signals 7, 7' in converted form during operation, which signal now has the reference potential R1 of the determination unit 5 as reference potential and is provided with the reference symbol 7". The signal 7" is supplied to a determination circuit 24, in which the signal 7" is evaluated.

The reference potential converter 21 is illustrated in the form of a transformer in the exemplary embodiment shown in FIG. 1.

In order to be able to supply operational energy to the determination circuit 24, the reference potential converter 21 and/or the measurement unit 4, the battery system 1 shown in FIG. 1 is formed with a supply unit 25. The supply unit 25 supplies a first supply circuit during operation, which first supply circuit comprises at least the determination circuit 24. In addition, the supply unit 25 supplies a second supply circuit 27, which comprises at least the measurement unit 4. The desired reference potential R1, R2 is present in the respective supply circuits 26, 27.

The supply unit 25 is connected to the measurement unit 4 via a supply line 28 in such a way as to transmit energy. The supply line 28 supplies operational energy 29 to the measurement unit 4 from the supply unit 25. A supply line 30 is part of the first supply circuit 26 and provides operational energy 31 to the determination circuit 24.

The reference potential converter 21 is part of both the first and the second supply circuit 26, 27 and is supplied operational energy 29 and operational energy 31.

A potential line 32, which makes contact between the connection point 16 and the reference potential R1, is supplied to the supply unit 25 as part of the first supply circuit 26. Operational energy from the battery string 3 is fed to the supply unit 25 via a supply line 33 from the connection point 15 during operation.

The supply unit 25 is illustrated as a transformer, wherein the first supply circuit 26 feeds the second supply circuit 27.

A mechanical switch, for example a contactor 34, 35, can be provided at least between one of the connection contacts 13, 18 and the battery string 3 in order to disconnect the battery string 3 from the connection contacts 13, 18, if required.

Figure 2:
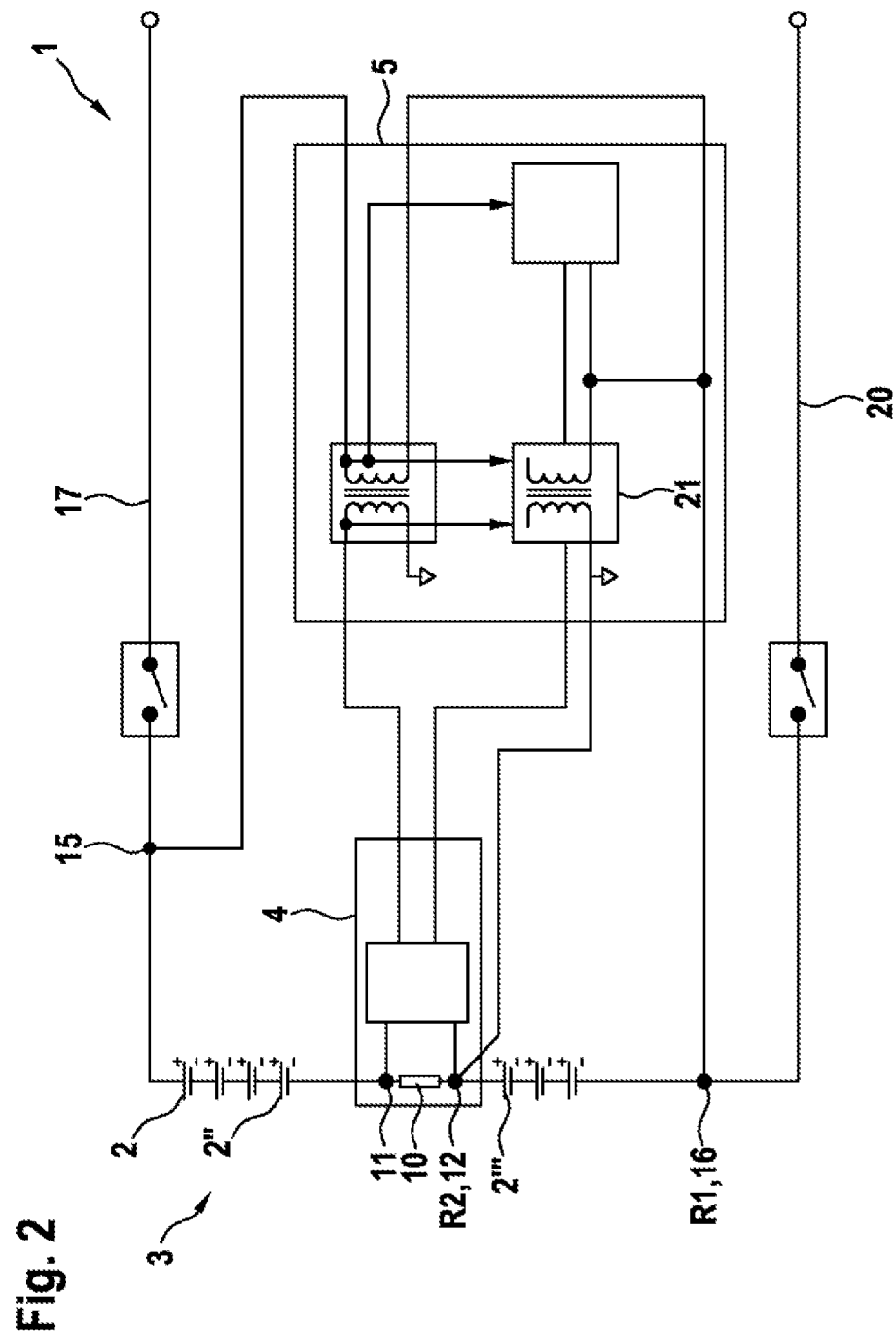
FIG. 2 shows a schematic illustration of a further exemplary embodiment of the battery system according to the disclosure.

FIG. 2 shows a further exemplary embodiment of the battery system 1 according to the disclosure, wherein the same reference symbols are used for elements which correspond in terms of function or design to the elements of the exemplary embodiment shown in FIG. 1.

For brevity, details are only given of the differences with respect to the exemplary embodiment shown in FIG. 1.

The battery system 1 shown in FIG. 2 differs from the battery system shown in FIG. 1 merely in terms of the arrangement of the current sensor 10. In FIG. 2, the current sensor 10 is integrated in the battery string 3 between two battery cells 2" and 2'" and is connected in series with the battery cells 2", 2'" via its contact points 11, 12. The connection points 15, 16 of the determination unit 5 are not only connected by a section of one of the connection lines 17, 20, but also via at least one battery cell 2", 2'" to the contact points 11, 12 in the exemplary embodiment shown in FIG. 2. In particular between the contact point 12 and the connection point 16 there is a potential difference between the reference potentials R1, R2 which can make it necessary to use the reference potential converter 21.

If the current sensor 10 is arranged at the end B of the battery string 3, the potential difference between the contact point 12 and the connection point 16 is at a maximum.

In the described exemplary embodiments, the battery system 1 can be at least partially part of a battery management system. The battery management system 1 can comprise at least one battery cell 2, which is in the form of a rechargeable lithium-ion battery.

The invention claimed is:

1. A battery system comprising:
   a battery string having at least one battery cell;
   a measurement unit programmed to provide a measurement signal corresponding to a battery current flowing through the battery string, the measurement unit connected in series with the at least one battery cell and having a current sensor connected in series with the at least one battery cell via contact points and configured to measure the conduct a battery current flowing through the battery string via contact points, the measurement unit programmed to operate with a first reference potential of a first supply circuit; and
   a determination unit programmed to receive the measurement signal from the measurement unit and evaluate connected to the battery string to transmit energy via connection points that are formed separately from the contact points, the determination unit being programmed to determine the battery current flowing through the battery string during operation of the battery system, the determination unit configured to operate with a second reference potential of a second supply circuit, the second supply circuit drawing having a determination circuit that is connected, with transmission of signals, to the measurement unit and draws operational energy from the battery string via connection points that are formed separately from the contact points.

2. The battery system as claimed in claim 1, wherein:
the battery string has at least two battery cells connected in series with one another;
the current sensor is connected in series with and between two of the at least two battery cells; and
the connection points of the second supply circuit are electrically conductively connected to a first end and a second end of the battery string.

3. The battery system as claimed in claim 1, further comprising:
a reference potential converter configured to connect the current sensor and the determination unit and provide the measurement signal from the measurement unit to the determination unit, the first reference potential of the first supply circuit being is present at an input side of the reference potential converter and the second reference potential of the second supply circuit being is present at an output side of the reference potential converter.

4. The battery system as claimed in claim 1, wherein the measurement unit has a measurement signal transducer configured to convert a signal generated by the current sensor into a data signal, the data signal being provided as the measurement signal.

5. The battery system as claimed in claim 3, wherein the reference potential converter includes a transformer.

6. The battery system as claimed in claim 1, further comprising:
a supply unit configured to, during the operation of the battery system, supply operational energy to the first supply circuit from second supply circuit.

7. The battery system as claimed in claim 6, wherein the supply unit is configured to galvanically isolate the first supply circuit from the second supply circuit.

8. The battery system as claimed in claim 7, wherein the supply unit includes a transformer.

9. A battery comprising:
a housing;
a pair of terminals; and
a battery system connected between the pair of terminals, the battery system comprising:
a battery string having at least one battery cell;
a measurement unit programmed to provide a measurement signal corresponding to a battery current flowing through the battery string, the measurement unit having a current sensor connected in series with the at least one battery cell via contact points and configured to measure the conduct a battery current flowing through the battery string, the measurement unit programmed to operate with a first reference potential of a first supply circuit; and
a determination unit programmed to receive the measurement signal from the measurement unit and evaluate the battery current flowing through the battery string during operation of the battery system, the determination unit programmed to operate with a second reference potential of a second supply circuit, the second supply circuit drawing operational energy from the battery string via connection points that are formed separately from the contact points.

10. A motor vehicle comprising:
a drive system; and
a battery system connected to the drive system, the battery system comprising:
a battery string having at least one battery cell;
a measurement unit programmed to provide a measurement signal corresponding to a battery current flowing through the battery string, the measurement unit having a current sensor connected in series with the at least one battery cell via contact points and configured to measure the battery current flowing through the battery string, the measurement unit programmed to operate with a first reference potential of a first supply circuit; and
a determination unit programmed to receive the measurement signal from the measurement unit and evaluate the battery current flowing through the battery string during operation of the battery system, the determination unit programmed to operate with a second reference potential of a second supply circuit, the second supply circuit drawing operational energy from the battery string via connection points that are formed separately from the contact points.

* * * * *

UNITED STATES PATENT AND TRADEMARK OFFICE
CERTIFICATE OF CORRECTION

PATENT NO. : 9,673,488 B2  
APPLICATION NO. : 14/403590  
DATED : June 6, 2017  
INVENTOR(S) : Chrysanthos Tzivanopoulos Page 1 of 2

It is certified that error appears in the above-identified patent and that said Letters Patent is hereby corrected as shown below:

On the Title Page

Item (71) should read:  
Applicant: Robert Bosch GmbH, Stuttgart (DE);  
      Samsung SDI Co., Ltd., Yongin-si,  
      Gyeonggi-do (KR)

In the Claims

In Column 8, Lines 40-67, Lines 1-27 of Claim 1 should be corrected as follows:
1. A battery system comprising:
a battery string having at least one battery cell;
a measurement unit programmed to provide a measure-
    ment signal corresponding to a battery current flowing
    through the battery string, the measurement unit
    having a current sensor connected in series with the at
    least one battery cell via contact points and configured
    to measure the battery current flowing
    through the battery string, the mea-
    surement unit programmed to operate with a first
    reference potential of a first supply circuit; and
a determination unit programmed to receive the measure-
    ment signal from the measurement unit and evaluate
    the battery current flowing
    through the battery string during operation of the
    battery system, the determination unit programmed to
    operate with a second reference potential of a second
    supply circuit, the second supply circuit drawing Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 9,673,488 B2 operational energy from the battery string via
    connection points that are formed separately from the
    contact points.

In Column 9, Lines 9-19, Lines 1-10 of Claim 3 should read:
3. The battery system as claimed in claim 1, further comprising:
    a reference potential converter configured to connect the
    current sensor and the determination unit and provide
    the measurement signal from the measurement unit to
    the determination unit, the first reference potential of
    the first supply circuit being present at an input side
    of the reference potential converter and the second
    reference potential of the second supply circuit being
    present at an output side of the reference potential
    converter.

In Column 10, Lines 5-7, Lines 11-13 of Claim 9 should read:
at least one battery cell via contact points and
configured to measure the battery current
flowing through the battery string, the measurement